United States Patent
Sakamoto

(10) Patent No.: US 7,078,706 B2
(45) Date of Patent: Jul. 18, 2006

(54) CHAMBER, EXPOSURE APPARATUS, AND DEVICE MANUFACTURING METHOD

(75) Inventor: Eiji Sakamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/859,770

(22) Filed: Jun. 3, 2004

(65) Prior Publication Data

US 2005/0011581 A1   Jan. 20, 2005

(30) Foreign Application Priority Data

Jun. 5, 2003 (JP) ............................. 2003-160677

(51) Int. Cl.
*G01F 23/00* (2006.01)
*G21K 5/08* (2006.01)
*G21K 5/10* (2006.01)

(52) U.S. Cl. ........................ 250/440.11; 250/441.11; 250/442.11; 378/20; 378/34

(58) Field of Classification Search ............ 250/492.3, 250/440.11, 441.11, 442.11, 306, 307, 492.1–492.2, 250/491.1; 378/20, 34
See application file for complete search history.

(56) References Cited

U.S. PATENT DOCUMENTS

| | | | | |
|---|---|---|---|---|
| 3,608,023 A | * | 9/1971 | Scarborough | ............... 264/102 |
| 4,113,175 A | * | 9/1978 | Sutton, Jr. | ................. 236/46 A |
| 4,311,037 A | * | 1/1982 | Gotchel et al. | ................. 73/38 |
| 4,420,969 A | * | 12/1983 | Saum | ............................. 73/40 |
| 5,871,587 A | | 2/1999 | Hasegawa et al. | |
| 5,957,317 A | * | 9/1999 | Lee | ............................. 220/212 |
| 6,616,898 B1 | * | 9/2003 | Hara et al. | ................... 422/112 |
| 6,865,926 B1 | * | 3/2005 | O'Brien et al. | ............ 73/23.27 |
| 6,873,397 B1 | * | 3/2005 | Yabu | ............................. 355/30 |
| 6,940,582 B1 | * | 9/2005 | Tanaka | ........................ 355/53 |
| 2002/0036264 A1 | * | 3/2002 | Nakasuji et al. | ............ 250/306 |
| 2002/0148961 A1 | * | 10/2002 | Nakasuji et al. | ............ 250/311 |
| 2003/0202449 A1 | * | 10/2003 | Miura et al. | ................ 369/101 |
| 2004/0046294 A1 | * | 3/2004 | Kubo et al. | .................. 267/136 |
| 2005/0011581 A1 | * | 1/2005 | Sakamoto | .................... 141/65 |
| 2005/0092921 A1 | * | 5/2005 | Nakasuji et al. | ............ 250/306 |

FOREIGN PATENT DOCUMENTS

| | | |
|---|---|---|
| JP | 3-211816 | 9/1991 |
| JP | 7-281446 | 10/1995 |

* cited by examiner

*Primary Examiner*—Nikita Wells
*Assistant Examiner*—Bernard E. Souw
(74) *Attorney, Agent, or Firm*—Morgan & Finnegan, LLP

(57) ABSTRACT

Disclosed is a chamber having a static-pressure bearing disposed therein, the chamber including an inside pressure gauge for detecting an inside pressure of said chamber, and a pressure controller for decreasing the inside pressure of the chamber on the basis of the detection made through the inside pressure gauge. This arrangement effectively prevents unwanted increase of the chamber inside pressure and avoids local breakage of the chamber.

6 Claims, 4 Drawing Sheets

CHAMBER, EXPOSURE APPARATUS, AND DEVICE MANUFACTURING METHOD

FIELD OF THE INVENTION AND RELATED ART

This invention relates to a semiconductor exposure apparatus and, more particularly, to a chamber structure to be used with an X-ray, EUV (extreme ultraviolet) or EB (electron beam) exposure apparatus for performing exposure in a vacuum ambience, the chamber structure being specifically arranged for facilitating stage maintenance.

In exposure apparatuses arranged to perform exposure in a vacuum environment, such as X-ray exposure apparatus, EUV exposure apparatus and EB exposure apparatus, hydrostatic or static-pressure bearing assemblies are used as guide means for a moving stage as disclosed in Japanese Laid-Open Patent Application No. 03-211816, for example. Generally, a static-pressure bearing assembly to be used in a vacuum ambience is equipped with a supplying-system piping for supplying a gas to a static-pressure pad and an exhausting-system piping for collecting the gases to prevent gas leakage toward the outside of the static-pressure bearing. Additionally, the structure disclosed in the aforementioned Japanese patent document took a safety precaution that the discharging system piping of the static-pressure bearing was opened to the atmosphere when an electric power was interrupted, this being for protection of the static-pressure bearing, for example.

However, generally in vacuum chambers, there is a possibility that, when the static-pressure bearing is operated in a state that a leak valve for communicating the vacuum chamber with the atmosphere is closed (that is, in a state that the vacuum-chamber inside is not opened to the atmosphere) and if a gas to be supplied to the static-pressure pad leaks into the vacuum chamber due to some failure of the apparatus or to operator's mistake, the pressure inside the vacuum chamber becomes positive (higher) with reference to the atmospheric pressure. Although vacuum chambers are generally designed so that it can stand the pressure of atmosphere in the sense that the inside pressure thereof is reduced (negative) relative to the outside atmospheric pressure, the design is not effective where the inside pressure of the chamber becomes positive relative with reference to the atmospheric pressure, to the contrary. Thus, because of weak strength of the chamber, there is a possibility of local breakage of the chamber.

SUMMARY OF THE INVENTION

The present invention has been made in consideration of these inconveniences, and it is an object of the present invention provide a safety mechanism that can cope with a situation that the inside pressure of a vacuum chamber becomes a positive pressure with reference to the atmospheric pressure due to some failure of the apparatus or to operator's mistake.

In accordance with an aspect of the present invention, to achieve the above-described object, there is provided a chamber having a static-pressure bearing disposed therein, said chamber comprising: an inside pressure gauge for detecting an inside pressure of said chamber; and a pressure controller for decreasing the inside pressure of said chamber on the basis of the detection made through said inside pressure gauge.

In accordance with another aspect of the present invention, there is provided a chamber having a static-pressure bearing disposed therein, said chamber comprising: a differential pressure gauge for detecting a differential pressure between an inside and an outside of said chamber; and a pressure controller for decreasing the inside pressure of said chamber on the basis of the detection made through said differential pressure gauge.

In accordance with a further aspect of the present invention, there is provided a chamber having a static-pressure bearing disposed therein, said chamber comprising: an inside pressure gauge for detecting an inside pressure of said chamber; an outside pressure gauge for detecting an outside pressure of said chamber; and a pressure controller for decreasing the inside pressure of said chamber on the basis of the detections made through said inside pressure gauge and said outside pressure gauge.

In one preferred form of this aspect of the present invention, the pressure controller decreases the inside pressure of said chamber when the inside pressure of said chamber is higher than the outside pressure of said chamber.

Also, in this aspect of the present invention, the pressure controller may decrease the inside pressure of said chamber when the inside pressure of said chamber is higher than the outside pressure of said chamber, by a predetermined amount.

The pressure controller may include a piping for communicating the inside of said chamber with the outside of said chamber, and an adjusting device for adjusting a degree of opening of said piping on the basis of the detections made through said inside pressure gauge and said outside pressure gauge.

The pressure controller may include a piping for communicating the inside of said chamber with the outside of said chamber, and a check valve for enabling flow of a gas from the inside of said chamber to the outside of said chamber and also for restricting a flow of a gas from the outside of said chamber to the inside of said chamber.

In accordance with a yet further aspect of the present invention, there is provided an exposure apparatus, comprising: an exposure processing system for performing an exposure process to a substrate, said exposure processing system having a static-pressure bearing; and a chamber having said exposure processing system accommodated therein, said chamber including (i) an inside pressure gauge for detecting an inside pressure of said chamber, (ii) an outside pressure gauge for detecting an outside pressure of said chamber, and (iii) a pressure controller for decreasing the inside pressure of said chamber on the basis of the detections made through said inside pressure gauge and said outside pressure gauge.

In one preferred form of this aspect of the present invention, the exposure processing system performs an exposure process to the substrate by use of one of X-ray beam, EUV light and electron beam, wherein the inside of the chamber is controlled to provide a vacuum ambience there.

In accordance with a still further aspect of the present invention, there is provided an exposure apparatus, comprising: an irradiating system for projecting one of X-ray beam, EUV light and electron beam onto a substrate; a stage for moving the substrate, said stage having a static-pressure bearing including a stationary portion and a movable portion, a predetermined gas being supplied to between the stationary portion and the movable portion of said bearing; and a chamber having said irradiating system and said stage accommodated therein, said chamber being controlled to provide a vacuum ambience inside said chamber, and said chamber having a pressure controller for controlling an inside pressure of said chamber to prevent the inside pressure from exceeding a predetermined value as a result of the predetermined gas supplied to the static-pressure bearing.

In one preferred form of this aspect of the present invention, the predetermined gas is nitrogen, helium or inactive gas.

Further, in this aspect of the present invention, the pressure controller may include a piping for communicating the inside of said chamber with the outside of said chamber, and an adjusting device for adjusting a degree of opening of said piping on the basis of the detections made through said inside pressure gauge and said outside pressure gauge.

In accordance with a yet further aspect of the present invention, there is provided a device manufacturing method, comprising the steps of: performing an exposure process to a substrate by use of an exposure apparatus as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

ENBODIMENT 1

Figure 1:
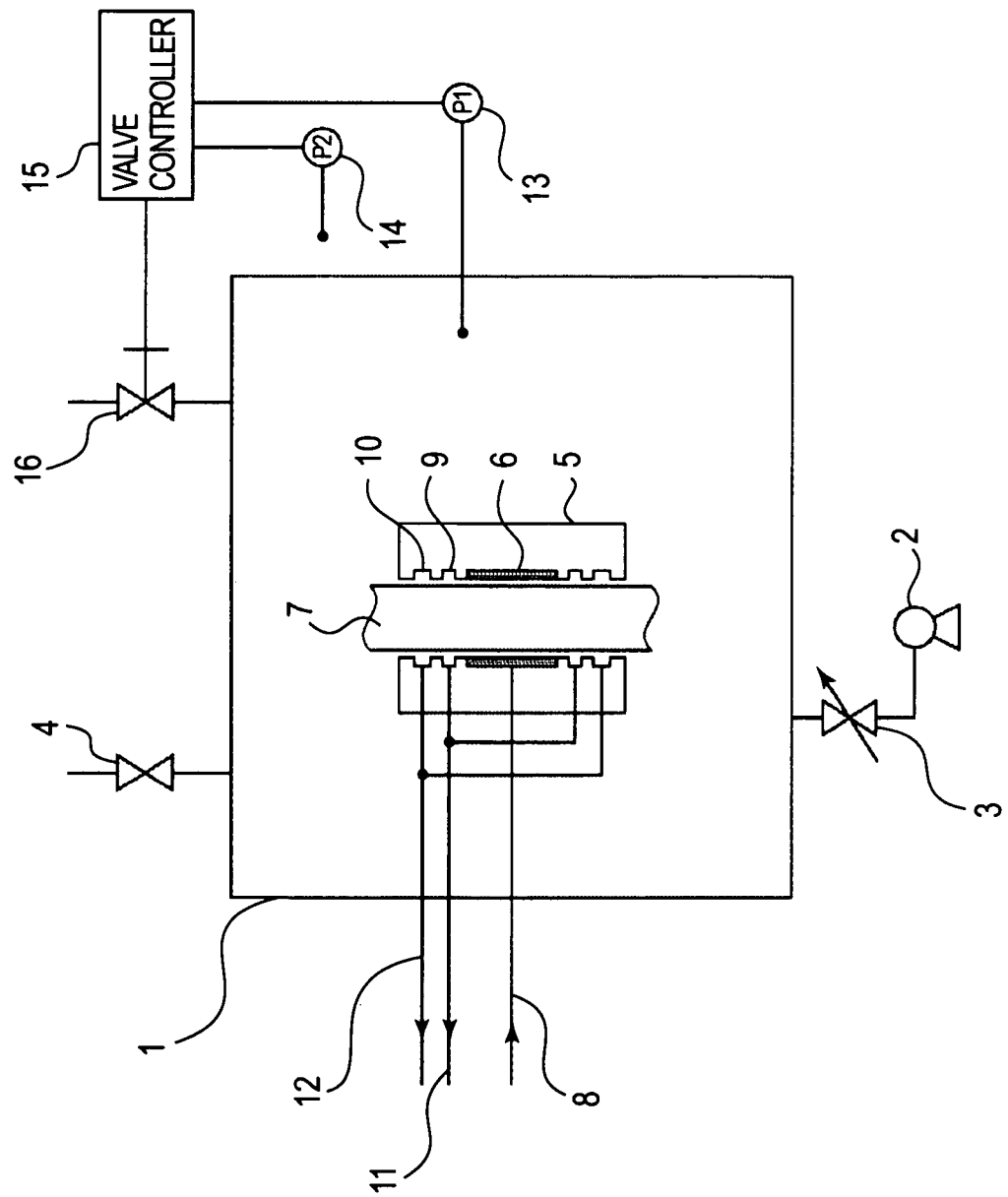
FIG. 1 is a schematic view and diagrammatic view of a first embodiment of the present invention.

FIG. 1 illustrates the structure of a vacuum chamber according to a first embodiment of the present invention. Denoted at 1 is a vacuum chamber, and denoted at 2 is a vacuum pump. Denoted at 3 is a valve for separating the vacuum chamber and the vacuum pump from each other. Denoted at 4 is a leak valve for introducing atmosphere into the vacuum chamber.

A static-pressure bearing comprises a housing 5, a bearing pad 6 and a guide bar 7, and this bearing is used as guide means for a moving stage (not shown) such as reticle stage or wafer stage. In this static-pressure bearing assembly, a gas-supply system piping 8 supplies a gas to the bearing pad, from the outside of the vacuum chamber. With this gas supply, a thin gas layer is formed between the bearing pad and the guide bar, such that the friction between them can be made small and the moving stage can be moved smoothly at a high speed. As regards the gas to be supplied to between the bearing pad and the guide bar, it may be any gas such as air, nitrogen, or helium, for example, but preferably it is an inactive gas. The gas to be used is in accordance with an exposure method used or a system design, for example.

If the supplied gas leaks from the bearing into the vacuum chamber, the vacuum degree inside the chamber is degraded. In order to prevent this, the bearing assembly is provided with exhaust grooves 9 and 10 for collecting the supplied gas and exhaust-system pipes 11 and 12 for discharging the collected gas outwardly of the vacuum chamber. In this embodiment, as described, double exhaust-groove systems (exhaust groove 9 and exhaust groove 10) are used to reduce gas leakage into the vacuum chamber. However, triple or more exhaust-groove systems may be used.

Denoted at 13 is a pressure gauge for detecting the pressure inside the vacuum chamber, and denoted at 14 is a pressure gauge for detecting the atmospheric pressure. With these pressure gauges, a differential pressure between the atmosphere and the inside of the vacuum chamber can be detected. Also, a single differential pressure gauge having the function of both of the pressure gauges 13 and 14 may be used. Furthermore, only the pressure gauge 13 for detecting the inside pressure of the vacuum chamber may be used to detect the differential pressure, while taking the atmospheric pressure as being already known.

Denoted at 15 is a valve controller for controlling the degree of opening of an atmosphere open valve 16 mounted on the vacuum chamber, in response to detection of the differential pressure described above. For example, if the inside pressure of the vacuum chamber becomes higher than the outside pressure, there occurs a possibility of breakage of the chamber. For this reason, when the pressure inside the chamber becomes higher than the pressure outside the chamber by a predetermined value, the valve controller 15 opens the atmosphere open valve 16 (more exactly, to increase the degree or opening thereof, or to open more), thereby to decrease the inside pressure of the chamber. Thus, the differential pressure between inside and outside the chamber can be made smaller. As a matter of course, where a vacuum is going to be created inside the chamber, the atmosphere open valve should be kept closed. The atmosphere open valve may be provided anywhere, if pressure communication is assured, and similar effects will be attainable. For example, it may be provided in a portion of the pipe connected to the vacuum chamber, and this is within the scope of the present invention.

Where the inside of the vacuum chamber should be kept at atmosphere for maintenance of the moving stage, if the gas supply to the static-pressure bearing is interrupted, the static-pressure pad may contact the guide bar to cause damage of the static-pressure bearing. Thus, in order to avoid damage of the static-pressure bearing, the gas supply from the gas-supply system piping 8 is kept, while on the other hand, the gas collecting function of the exhaust-system pipes 11 and 12 is discontinued. Then, the gas discharged from the static-pressure bearing collects inside the vacuum chamber so that the pressure inside the vacuum chamber increases gradually. Then, the leak valve of the vacuum chamber is opened, and the atmosphere outside the vacuum chamber is introduced into the chamber. As a result, the maintenance operation can be done under the condition that there is substantially no difference between the chamber inside pressure and the chamber outside pressure.

The leak valve of the vacuum chamber is kept closed when a vacuum should be created inside the chamber. In consideration of this, in many cases, a normally closed type valve is used therefor. This leads to a possibility that the leak valve is held closed during the maintenance operation because of some failure in the apparatus or of operator's mistake. If the static-pressure bearing operates in this state, the gas supplied into the vacuum chamber collects inside the chamber and it is not discharged out of the chamber. Therefore, the pressure inside the vacuum chamber increases gradually. If the inside pressure of the chamber becomes higher than the outside pressure of the chamber by a predetermined amount, the vacuum chamber may be broken.

In consideration of this, in the vacuum chamber of this embodiment, the pressure gauges 13 and 14 are used to continuously monitor the differential pressure between the chamber inside pressure and the atmospheric pressure. If it is detected, by the detection, that the inside pressure of the chamber becomes higher than the outside pressure of the chamber by a predetermined amount, the valve controller 15 operates to open the atmosphere open valve 16 so that the inside pressure of the vacuum chamber approximates to the chamber outside pressure. Thus, in accordance with the detected differential pressure (or detected pressure), the valve controller controls the degree of opening of the atmosphere open valve (the degree of opening may be changed successively or it may be changed stepwise and discontinuously), such that the pressure inside the vacuum chamber can be held with a pressure difference in a preset range, with reference to the atmospheric pressure.

EMBODIMENT 2

Figure 2:
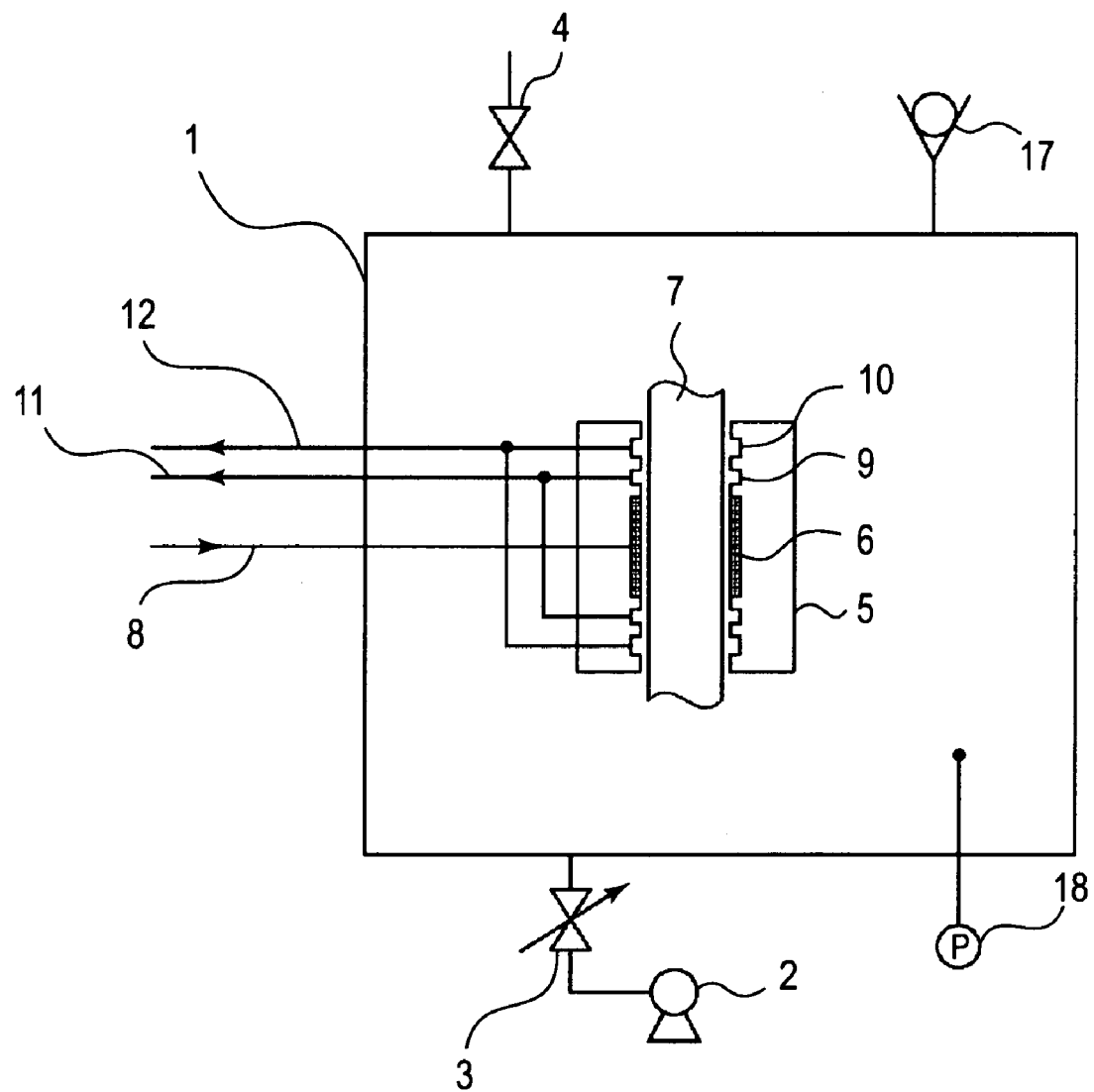
FIG. 2 is a schematic view and diagrammatic view of a second embodiment of the present invention.

FIG. 2 illustrates the structure according to a second embodiment of the present invention.

In this embodiment, as a safety system for the vacuum chamber, in place of the combination of a pressure gauge, a valve controller and an atmosphere open valve proposed in the first embodiment, a mechanical check valve 17 is used. The check valve is a valve having a function for enabling flow of a gas only in one direction and prohibiting the gas flow in an opposite direction. In this embodiment, regardless of a command from a pressure gauge 18, if the pressure inside the vacuum chamber becomes equal to or larger than the atmospheric pressure, the flow of a gas from inside the vacuum chamber to the atmosphere side is enabled. As a mater of course, the system may be arranged so that the check valve enables flow of a gas from the inside of the chamber to the outside of the chamber when the chamber inside pressure becomes higher than the chamber outside pressure by a predetermined amount.

As a further alternative, in place of using a check valve, a pipe having a large resistance (for example, a pipe having a very small gas flow rate, a narrow and long pipe, or a pipe having an S-shaped curve) may be used to provide communication between the inside and the outside of the chamber, and the large-resistance pipe may be kept opened from the start of maintenance till the end of the maintenance.

Anyway, with the structure described above, the vacuum chamber is equipped with a mechanical safety system, the safety and reliability of the apparatus can be improved at a relatively low cost.

In accordance with the embodiments of the present invention described hereinbefore, the pressure inside the vacuum chamber can be held at a level not greater than the atmospheric pressure (or alternatively, the inside pressure of the chamber can be held at a level not higher than the chamber outside pressure by a predetermined amount, that is, in other words, the difference between the chamber inside pressure and the chamber outside pressure can be held at a level not greater than a predetermined). As a result, where a static-pressure bearing is used in a vacuum chamber as a guide, breakage of the vacuum chamber which may occur as the chamber is opened to the atmosphere in the maintenance operation or the like, can be prevented.

Furthermore, the invention applies not only during the maintenance operation but also during normal operation, and an unexpected increase of the inside pressure of the vacuum chamber beyond the atmospheric pressure due to some failure in the gas-supply system piping or in the static-pressure bearing, not caused by an operator, can be prevented.

In an embodiment of the present invention, a valve controller opens an atmosphere open valve in accordance with the differential pressure between the inside pressure of the vacuum chamber and the atmospheric pressure. Since the atmosphere open valve can be opened or closed in response to a smaller change of the pressure, the system can be operated flexibly.

In an embodiment of the present invention, the vacuum chamber is equipped with a mechanical safety system based on a check valve. As a result, the safety and reliability of the apparatus can be improved with a relatively low cost.

A vacuum chamber such as described above may be used in an exposure apparatus, for example. Particularly, it may be suitably used as a vacuum chamber in an exposure apparatus for performing exposure on the basis of X-rays, an exposure apparatus for performing exposure on the basis of EUV light (wavelength of 13–14 nm), or an exposure apparatus for performing exposure by use of electron beam, for example. In such exposure apparatuses, where a vacuum space that surrounds a reticle state or a wafer stage is defined by a vacuum chamber such as described above, an exposure apparatus having a high safety and good reliability is accomplished. As a matter of course, an exposure light source (light source device), an illumination optical system for illuminating a reticle with light from a light source, a projection optical system for directing light from the reticle to a wafer (substrate to be exposed), and so on, may be accommodated in the above-described vacuum chamber. Here, while the term "vacuum chamber" has been used, the word "vacuum" refers to a state in which the pressure is lower then the atmospheric pressure. Preferably, it may be not greater than 10e-6 Pa.

A vacuum chamber having a static-pressure bearing accommodated therein, may be provided with a structure for communicating the inside of the vacuum chamber with the atmosphere when the inside pressure of the vacuum chamber becomes equal to or higher than the atmospheric pressure and, in that occasion, breakage of the chamber can be prevented effectively. To this end, it may have a structure that an atmosphere open valve may be opened or closed in response to an output of a pressure gauge that measures the pressure inside the vacuum chamber. Alternatively, the vacuum chamber may be equipped with a check valve to enable gas communication between the inside of the vacuum chamber and the atmosphere. This accomplishes a simpler structure. If such vacuum chamber is used in an X-ray, EUV or EB exposure apparatus, an apparatus having high safety is provided.

Alternatively, a vacuum chamber such as described above may be incorporated into an instrument having a static-pressure bearing, other than the exposure apparatus.

Next, referring to FIGS. 3 and 4, an embodiment of a device manufacturing method which uses an exposure apparatus such as described above (an exposure apparatus having a vacuum chamber according to the first embodiment or second embodiment), will be explained.

Figure 3:
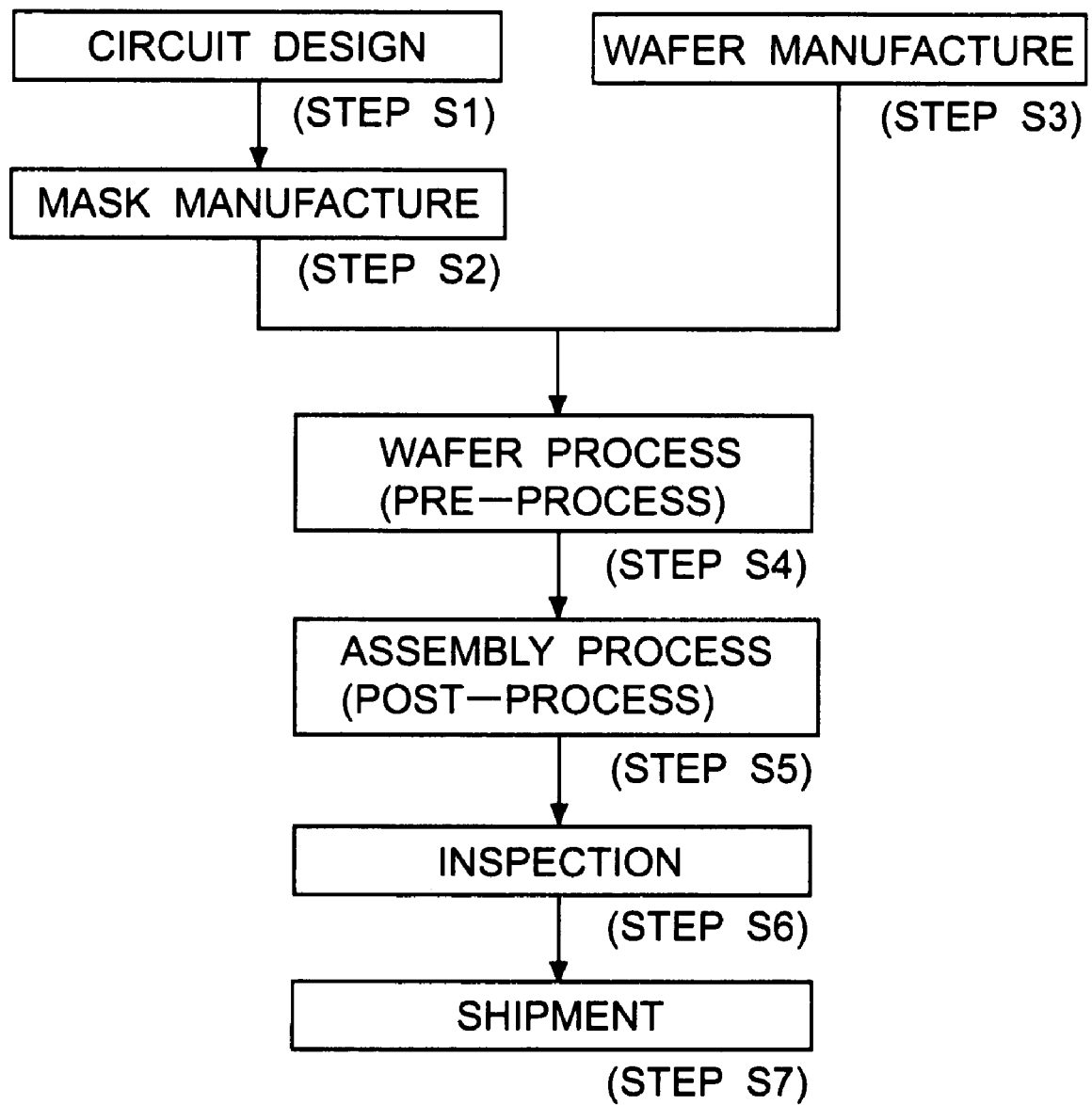
FIG. 3 is a flow chart for explaining manufacture of devices such as semiconductor chip (e.g. IC or LSI), liquid crystal device (LCD) or CCD, for example.

FIG. 3 is a flow chart for explaining the procedure of manufacturing various microdevices such as semiconductor chips (e.g., ICs or LSIs), liquid crystal panels, or CCDs, for example. In this embodiment, description will be made to an example of semiconductor chip production. Step S1 is a design process for designing a circuit of a semiconductor device. Step S2 is a process for making a mask on the basis of the circuit pattern design. Step S3 is a process for preparing a wafer by using a material such as silicon. Step S4 is a wafer process which is called a pre-process wherein, by using the thus prepared mask and wafer, a circuit is formed on the wafer in practice, in accordance with lithography. Step S5 subsequent to this is an assembling step which is called a post-process wherein the wafer having been processed at step S4 is formed into semiconductor chips. This step includes an assembling (dicing and bonding) process and a packaging (chip sealing) process. Step S6 is an inspection step wherein an operation check, a durability check an so on, for the semiconductor devices produced by step S5, are carried out. With these processes, semiconductor devices are produced, and they are shipped (step S7).

Figure 4:
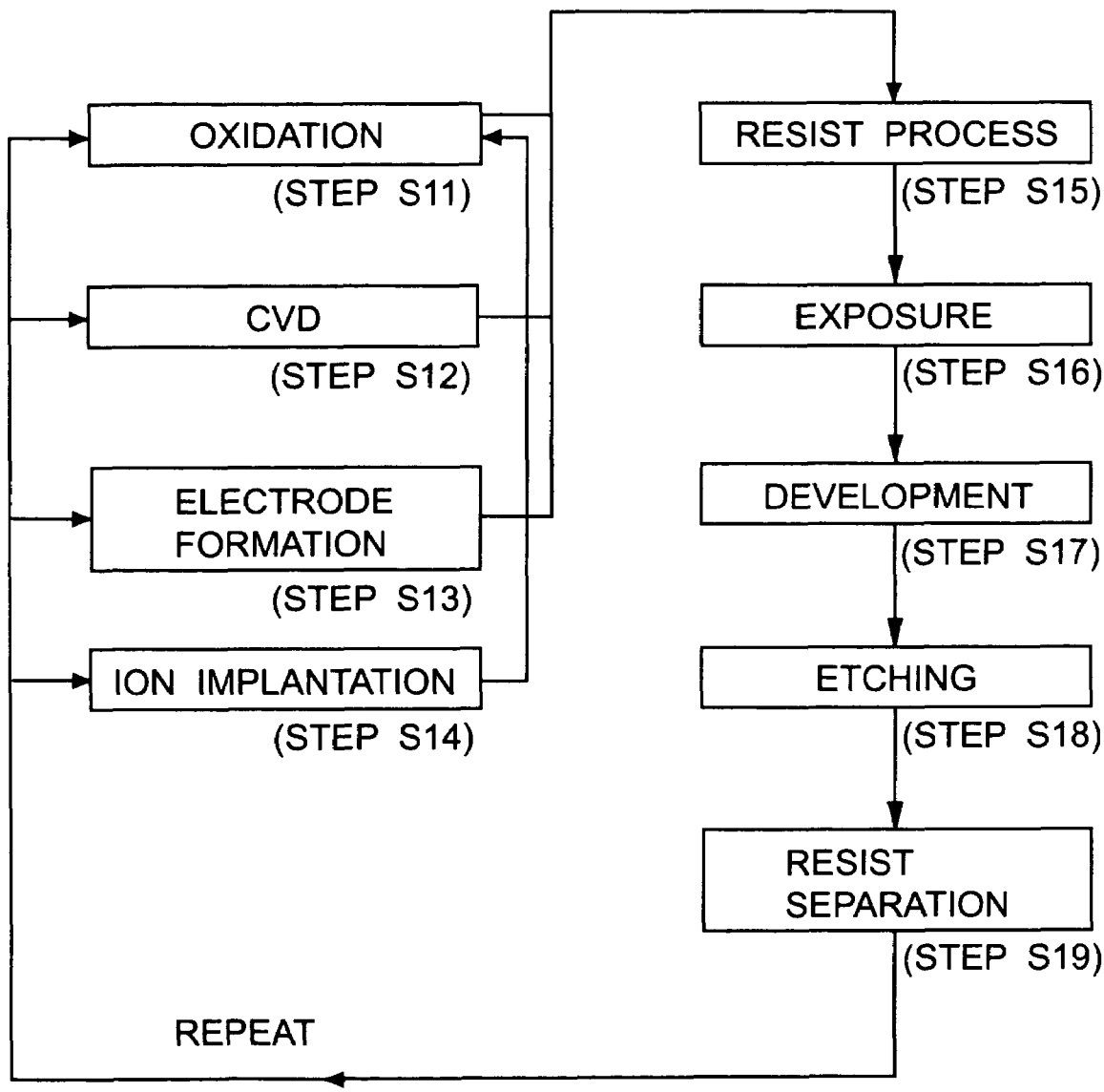
FIG. 4 is a flow chart for explaining details of a wafer process at step S4 in FIG. 3.

FIG. 4 is a flow chart for explaining details of the wafer process at step S4. Step S11 is an oxidation process for oxidizing the surface of a wafer. Step S12 is a CVD process for forming an insulating film on the wafer surface. Step S13 is an electrode forming process for forming electrodes upon the wafer by vapor deposition. Step S14 is an ion implanting process for implanting ions to the wafer. Step S15 is a resist process for applying a resist (photosensitive material) to the wafer. Step S16 is an exposure process for printing, by exposure, the circuit pattern of the mask on the wafer through the exposure apparatus described above. Step S17 is a developing process for developing the exposed wafer. Step S18 is an etching process for removing portions other than the developed resist image. Step S19 is a resist separation process for separating the resist material remaining on the wafer after being subjected to the etching process. By repeating these processes, circuit patterns are superposedly formed on the wafer. With these processes, high density microdevices can be manufactured.

As described, a device manufacturing method that uses an exposure apparatus as well as a device as a product thereof, are also within the scope of the present invention.

In accordance with the present invention as described hereinbefore, even where a static-pressure bearing is used as a guide in a vacuum chamber, breakage of the chamber which may occur during the maintenance as a result of opening to the atmosphere, can be prevented effectively.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to a pattern, said apparatus comprising:
    a chamber in which a vacuum ambience is to be formed;
    a stage disposed in said chamber and configured to hold the substrate and to move;
    a static-pressure bearing disposed in said chamber and configured to guide movement of said stage;
    a supply-system piping configured to supply a gas to said static-pressure bearing from an outside of said chamber;
    an exhaust-system piping configured to discharge a gas, supplied to said static-pressure bearing from said supply-system piping, to an outside of said chamber to prevent the gas from leaking into said chamber; and
    A check valve configured to allow a gas to flow from an inside of said chamber to an outside of said chamber.

2. An apparatus according to claim 1, wherein said apparatus is configured to expose the substrate to one of an X-ray beam, EUV light and an electron beam.

3. An apparatus according to claim 1, wherein said static-pressure bearing is configured to be supplied with one of a nitrogen gas, a helium gas and an inactive gas.

4. A method of manufacturing a device, said method comprising steps of:
    exposing a substrate to a pattern using an exposure apparatus as defined in claim 1;
    developing the exposed substrate; and
    processing the developed substrate to manufacture the device.

5. An apparatus according to claim 1, wherein said check valve is configured to open when pressure of an ambience inside said chamber is higher than pressure of an ambience outside said chamber.

6. An apparatus according to claim 1, wherein said check valve is configured to open when pressure of an ambience inside said chamber is higher than pressure of an ambience outside said chamber by a predetermined amount.

* * * * *

UNITED STATES PATENT AND TRADEMARK OFFICE
CERTIFICATE OF CORRECTION

PATENT NO. : 7,078,706 B2 Page 1 of 1
APPLICATION NO. : 10/859770
DATED : July 18, 2006
INVENTOR(S) : Eiji Sakamoto It is certified that error appears in the above-identified patent and that said Letters Patent is hereby corrected as shown below:

Column 3, line 41: "ENBODIMENT" is changed to --EMBODIMENT--.

Claim 1, line 15 (Column 8, line 20): "A" is changed to --a--.

Signed and Sealed this

Fifth day of September, 2006

JON W. DUDAS
*Director of the United States Patent and Trademark Office*